United States Patent
Crotty et al.

(10) Patent No.: US 7,046,034 B2
(45) Date of Patent: *May 16, 2006

(54) PROGRAMMABLE LOGIC DEVICE HAVING HETEROGENEOUS PROGRAMMABLE LOGIC BLOCKS

(75) Inventors: Patrick J. Crotty, San Jose, CA (US); Tao Pi, Sunnyvale, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/144,901

(22) Filed: Jun. 3, 2005

(65) Prior Publication Data

US 2005/0231235 A1  Oct. 20, 2005

Related U.S. Application Data

(63) Continuation of application No. 10/167,339, filed on Jun. 10, 2002, now Pat. No. 6,970,012.

(51) Int. Cl.
*H03K 19/173* (2006.01)

(52) U.S. Cl. .............................. 326/38; 326/39; 326/40

(58) Field of Classification Search ............. 326/38–47
See application file for complete search history.

(56) References Cited

U.S. PATENT DOCUMENTS

| | | | |
|---|---|---|---|
| 4,758,985 A | 7/1988 | Carter | |
| 5,815,726 A | 9/1998 | Cliff | |
| 5,835,405 A | 11/1998 | Tsui et al. | |
| 6,118,298 A | 9/2000 | Bauer et al. | |
| 6,122,720 A * | 9/2000 | Cliff | 712/15 |
| 6,384,625 B1 | 5/2002 | Lee et al. | |
| 6,388,464 B1 | 5/2002 | Lacey et al. | |
| 6,462,577 B1 | 10/2002 | Lee et al. | |

* cited by examiner

*Primary Examiner*—Anh Q. Tran
(74) *Attorney, Agent, or Firm*—LeRoy D. Maunu

(57) ABSTRACT

A programmable logic device (PLD) having heterogeneous programmable logic blocks. In one embodiment, the PLD includes programmable interconnect circuitry and programmable input-output circuitry coupled to the programmable interconnect circuitry. An array of programmable logic blocks is coupled to the interconnect circuitry. Each programmable logic block includes a plurality of programmable logic elements coupled to the interconnect circuitry. Each of the programmable logic elements is programmable to implement a common set of functions, and at least one but less than all of the programmable logic elements is programmable to implement a set of supplemental functions.

5 Claims, 3 Drawing Sheets

PROGRAMMABLE LOGIC DEVICE HAVING HETEROGENEOUS PROGRAMMABLE LOGIC BLOCKS

This application is a continuation of Ser. No. 10/167,339 filed on Jun. 10, 2002, now U.S. Pat. No. 6,970,012.

FIELD OF THE INVENTION

The present invention generally relates to programmable logic devices (PLDs), and more particularly to heterogeneous programmable logic blocks in a PLD.

BACKGROUND

Field programmable gate arrays (FPGAs) are becoming increasingly popular devices for use in electronics systems. For example, communications systems employ FPGAs in large measure for their re-programmability. In general, the use of FPGAs continues to grow at a rapid rate because they permit relatively short design cycles, reduce costs through logic consolidation, and offer flexibility in their re-programmability.

Programmable logic blocks are central to the capabilities of FPGAs. An FPGA typically is implemented with an array of programmable logic blocks that are configurable to implement design-specific logic functions. The interconnections between programmable logic blocks are also configurable.

Advances in integrated circuit technology support implementing an increasing number of functions in a smaller area. This has allowed FPGAs to be designed with programmable logic blocks with additional built-in features. For example, programmable logic blocks in the of the Virtex II FPGA from Xilinx are configurable to support shift register and RAM functions.

Even though the feature-rich programmable logic blocks provide a great deal of added flexibility, in many cases a design will use only a small portion of the built-in functions. The added built-in features are thereby provided at the expense of wasted circuit space.

A system and method that address the aforementioned problems, as well as other related problems, are therefore desirable.

SUMMARY OF THE INVENTION

In various embodiments, the present invention provides heterogeneous programmable logic blocks for a programmable logic device (PLD). In one embodiment, the PLD includes programmable interconnect circuitry and programmable input-output circuitry coupled to the programmable interconnect circuitry. An array of programmable logic blocks is coupled to the interconnect circuitry. Each programmable logic block includes a plurality of programmable logic elements coupled to the interconnect circuitry. Each of the programmable logic elements is programmable to implement a common set of functions, and at least one but less than all of the programmable logic elements is programmable to implement a set of supplemental functions.

It will be appreciated that various other embodiments are set forth in the Detailed Description and claims which follow.

BRIEF DESCRIPTION OF THE DRAWINGS

Various aspects and advantages of the invention will become apparent upon review of the following detailed description and upon reference to the drawings in which.

DETAILED DESCRIPTION

Various embodiments of the present invention are described in terms of a Virtex II FPGA from Xilinx. Those skilled in the art will appreciate, however, that the invention could be implemented in other types of programmable logic devices (PLDs), as well as in other FPGA architectures.

Figure 1:
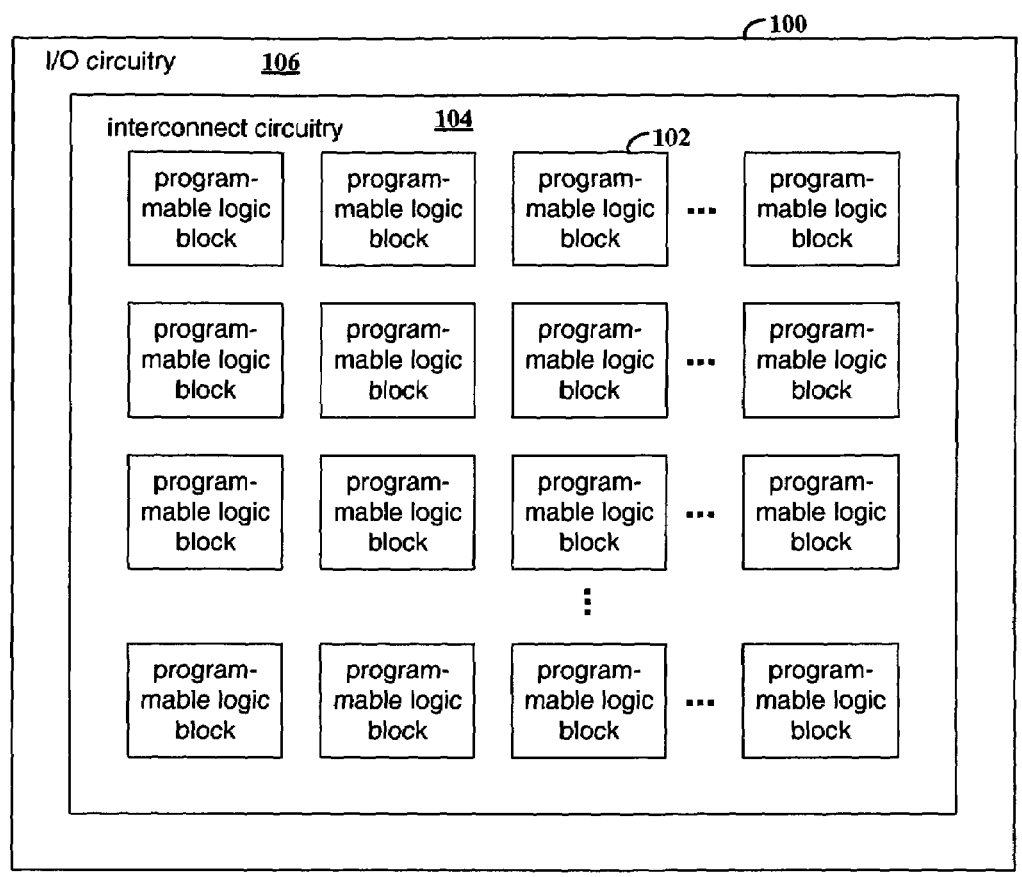
FIG. 1 is a functional block diagram of an example programmable logic device.

FIG. 1 is a functional block diagram of an example programmable logic device (PLD) 100. The PLD includes a plurality of programmable logic blocks 102 that are intercoupled via interconnect circuitry 104. Input signals to and output signals from the PLD are transmitted via I/O circuitry 106. To avoid cluttering the diagram the details of the interconnect circuitry and I/O circuitry are not shown. Instead, the space within block 104 that is not occupied by the programmable logic blocks represents the circuitry that intercouples the programmable logic blocks, and the space within block 106 that is not occupied by the interconnect circuitry represents the circuitry that provides the I/O signals to and from the interconnect circuitry.

Each of the programmable logic blocks has an associated set of memory cells that is configurable, and the state of the memory cells determines the logic function implemented by the programmable logic block. More complex functions can be implemented using multiple programmable logic blocks and configuring the interconnect circuitry to connect the blocks. The interconnect circuitry and the I/O circuitry also have associated memory cells, the state of which controls the interconnections between logic blocks and the interconnections with I/O pins of the device.

Figure 2:
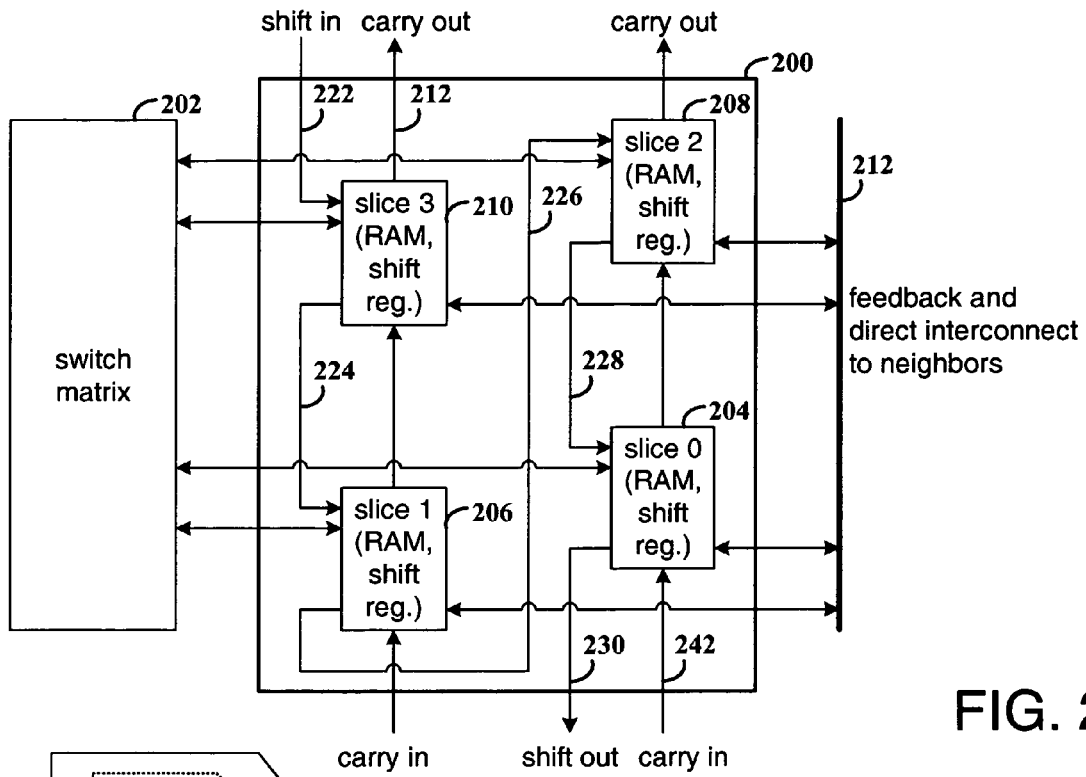
FIG. 2 is a block diagram of a prior art programmable logic block circuit arrangement.

FIG. 2 is a block diagram of a prior art programmable logic block circuit arrangement 200 for a Xilinx Virtex II FPGA. Each programmable logic block is coupled to a switch matrix 202, which provides access to the general routing matrix (not shown) of the device. A programmable logic block includes four similar slices 204, 206, 208, 210, which are labeled slice 0, slice 1, slice 2, and slice 3. The slices within the programmable logic block are coupled to signal lines 212 which provide direct feedback to the programmable logic block and direct interconnections to adjacent programmable logic blocks. The slices are arranged in two columns of two slices each. The slices in each column are configurable to implement an independent carry logic chain, and the slices of both columns are configurable to implement a shift register. The slices are similar in that the same basic functions are implemented in each slice.

Connections between the slices support implementation of shift register and arithmetic functions. When the programmable logic block is configured as a shift register, slice 3 receives a shift-in signal on line 222, a shift output signal is sent on line 224 from slice 3 to slice 1, a shift output signal is sent on line 226 from slice 1 to slice 2, a shift output signal is sent on line 228 from slice 2 to slice 0, and the shift-out signal from the programmable logic block is output from slice 0 on line 230.

The slices within the programmable logic block are configurable to implement carry chains for addition and multiplication functions. Slice 0 is configurable to receive a carry-in signal on line 242 from another programmable logic block, and slice 2 is configurable to receive the carry-out signal from slice 0 on line 244 and provide a carry-out signal on line 246. Slices 1 and 3 are similarly configurable.

Figure 3:
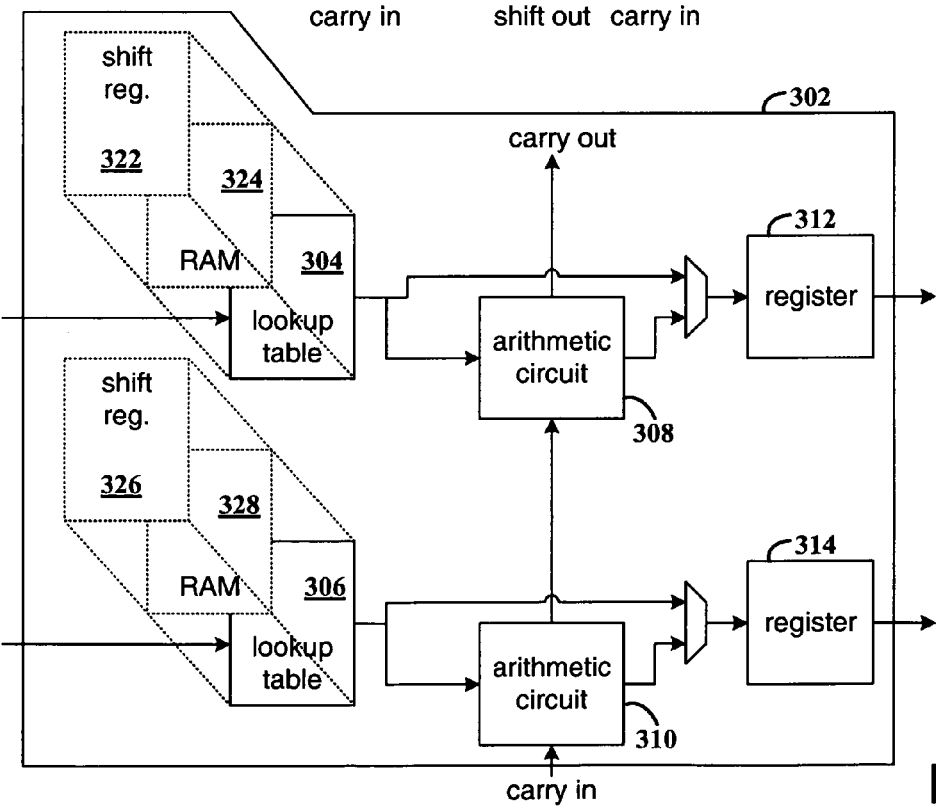
FIG. 3 is a block diagram of a prior art slice of a programmable logic device.

FIG. 3 is a block diagram of a prior art slice 302 of a programmable logic block. The slice includes two lookup tables (LUTs) 304, 306, arithmetic circuits 308, 310 associated with the LUTs, and registers 312, 314 for storing output data from the LUTs or arithmetic circuitry.

The LUTs are configurable, alone or in combination, to implement a user-specified function. In a Virtex II FPGA, each LUT receives 4 input signals, thereby providing the capability of implementing a Boolean function of 4 inputs. Additional multiplexers (not shown) provide the capability to combine the LUTs to implement a function of up to 8 inputs.

The arithmetic circuits 308 and 310 support implementation of adders and multipliers. Each arithmetic circuit is configurable to receive a carry-in signal, which is a carry-out signal from another arithmetic circuit. The slices can be chained together to implement adders and multipliers of the desired length.

In addition to the basic configurable logic and arithmetic functions, each LUT has associated built-in logic that supports additional configurable functions. For example, in the Virtex II FPGA, each LUT includes configurable logic for implementing shift register and RAM functionality. This shift register and RAM functionality are illustrated with blocks 322 and 324 in association with LUT 304 and with blocks 326 and 328 in association with LUT 306.

Each LUT is configurable to implement a 16-bit shift register, and the programmable logic block is configurable to connect all the LUTs to form a 128-bit shift register.

Each LUT is configurable to implement a 16×1-bit synchronous RAM. The synchronous RAM elements within a programmable logic block are configurable to implement either a single-port or a dual-port RAM of a selected size. For example, in single-port arrangements the LUTs of a programmable logic block are configurable to implement a 16×8-bit, 32×4-bit, 64×2-bit, or 128×1-bit RAM. In a dual-port arrangement, the LUTs of a programmable logic block are configurable to implement a 16×4-bit, 32×2-bit, or a 64×1-bit RAM.

Figure 4:
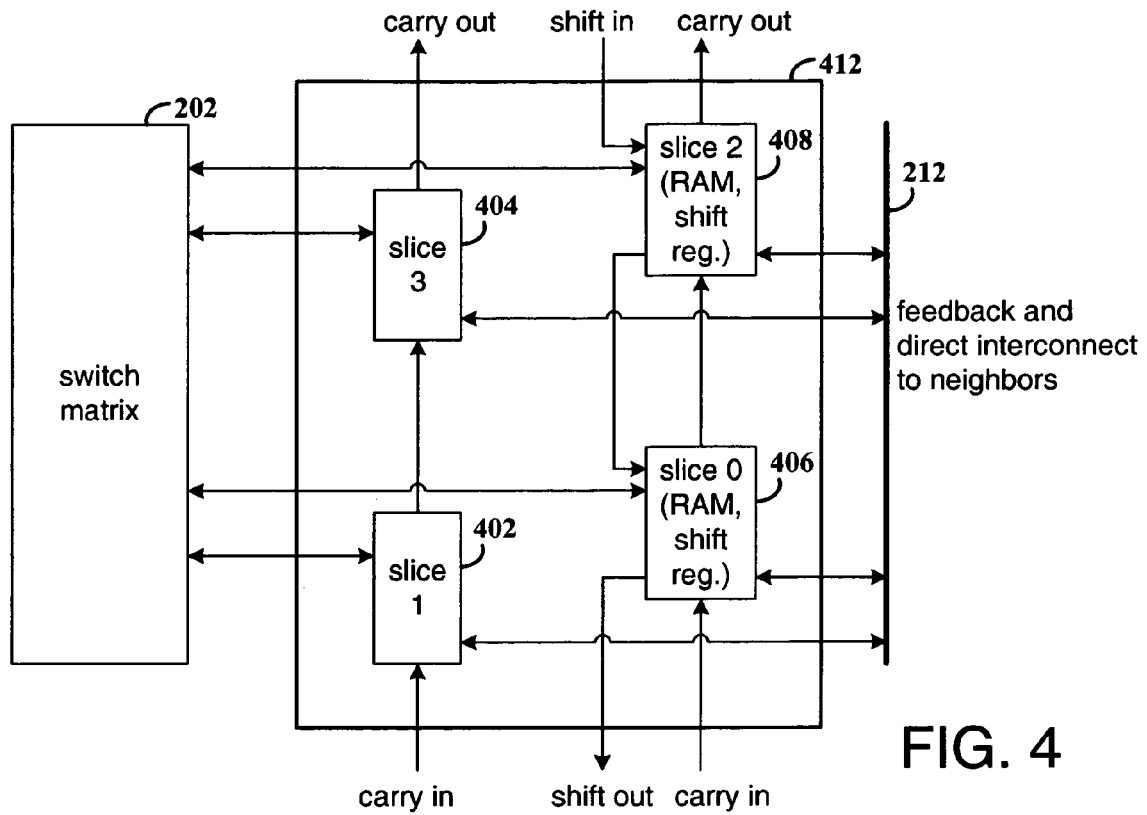
FIG. 4 is a block diagram of a programmable logic block circuit arrangement in accordance with one embodiment of the invention.

FIG. 4 is a block diagram of a programmable logic block circuit arrangement in accordance with one embodiment of the invention. In the example embodiment, slices 402 and 404 are implemented without the built-in configurable RAM and shift register functions, and the other two slices (406 and 408) are implemented with the configurable RAM and shift register functions. In the example embodiment, slices 0–4 are coupled to switch matrix 202 and interconnect lines 212 as in the prior art.

Because the RAM and shift register functions are not implemented in slices 1 and 3, the shift-in and shift-out signal lines are not needed between slices 3 and 1 nor between slices 1 and 2. Slices 0 and 2 include the configurable logic for implementing a shift register. Thus, programmable logic block 412 is configurable to implement a 64-bit shift register.

Slices 1 and 3 are also stripped of the built-in RAM function, and slices 0 and 2 have the RAM function available. Because only two of the slices provide the RAM function, the supported sizes of single port RAMs and dual port RAMS are reduced. In single-port arrangements the LUTs of a programmable logic block are configurable to implement a 16×4-bit, 32×2-bit, 48×1-bit, or 64×1-bit RAM. In a dual-port arrangement, the LUTs of a programmable logic block are configurable to implement a 16×2-bit or 32×1-bit RAM.

In an alternative embodiment, one pair of slices in a programmable logic block provides one of the built-in functions, and the other pair of slices provides the other built-in function. It will be appreciated that specific PLD design objectives and the number and character of the built-in functions will dictate which slices (or comparable circuits in other architectures) are implemented with which built-in functions.

By providing the configurable built-in functions in only selected slices of a programmable logic block, or alternatively, distributing the built-in functions across different slices, the capabilities of the built-in functions remain available to designers while space occupied by the programmable logic blocks is reduced.

Figure 5:
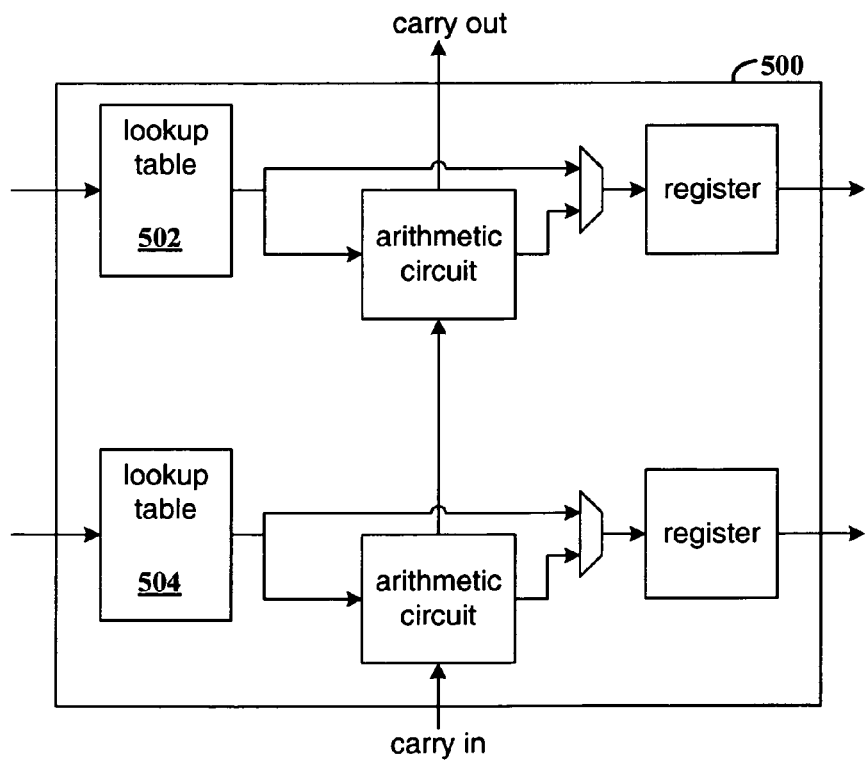
FIG. 5 is a block diagram of a slice in accordance with one embodiment of the invention.

FIG. 5 is a block diagram of a slice 500 in accordance with one embodiment of the invention. The example slice 500 includes LUTs 502 and 504, which are stripped of the shift register and RAM functions in comparison to the counterpart LUTs 304 and 306 of FIG. 3. In all other respects slice 500 is similar to slice 302 of FIG. 3. It will be appreciated that in other embodiments, built-in functions are distributed across the various LUTs, thereby resulting in different LUTs having different built-in functions.

The present invention is believed to be applicable to a variety of PLDs and has been found to be particularly applicable and beneficial in FPGAs. Other aspects and embodiments of the present invention will be apparent to those skilled in the art from consideration of the specification and practice of the invention disclosed herein. It is intended that the specification and illustrated embodiments be considered as examples only, with a true scope and spirit of the invention being indicated by the following claims.

What is claimed is:

1. A programmable logic device comprising:
   programmable interconnect circuitry;
   programmable input-output circuitry coupled to the programmable interconnect circuitry; and
   an array of programmable logic blocks, each logic block including a plurality of programmable logic elements coupled to the interconnect circuitry, wherein at least one of the programmable logic elements in a logic block is programmable to implement a first set of functions, and at least one other of the programmable logic elements in the logic block is programmable to implement a second set of functions that is a proper subset of the first set of functions; and
   wherein each programmable logic element includes at least one lookup table having input ports coupled to the programmable interconnect circuitry and at least one look-up table programmable to implement a logic function; and
   wherein each programmable logic element further includes at least one storage element having an input port coupled to an output port of a corresponding lookup table and an output port coupled to the programmable interconnect circuitry.

2. The programmable logic device of claim 1, wherein a function in the first set and not in the second set is a shift register function.

3. The programmable logic device of claim 1, wherein each logic block includes an even number of programmable logic elements, one half of the programmable logic elements in each logic block are programmable to implement the first set of functions, and one half of the programmable logic elements in each logic block are programmable to implement the second set of functions.

4. The programmable logic device of claim 1, wherein each programmable logic element further includes a programmable arithmetic circuit associated with a lookup table and having input ports and output ports, the input ports coupled to the output port of the associated lookup table, the programmable interconnect circuitry, and to an output port of an arithmetic circuit associated with another lookup table.

5. A programmable logic device comprising:
  programmable interconnect circuitry;
  programmable input-output circuitry coupled to the programmable interconnect circuitry; and
  an array of programmable logic blocks, each logic block including a plurality of programmable logic elements coupled to the interconnect circuitry, wherein at least one of the programmable logic elements in a logic block is programmable to implement a first set of functions, and at least one other of the programmable logic elements in the logic block is programmable to implement a second set of functions that is a proper subset of the first set of functions; and
  wherein each programmable logic element includes at least one lookup table having input ports coupled to the programmable interconnect circuitry and at least one look-up table programmable to implement a logic function; and
  wherein each programmable logic element further includes a programmable arithmetic circuit associated with a lookup table and having input ports and output ports, the input ports coupled to the output port of the associated lookup table.

* * * * *